United States Patent
Boehne

(10) Patent No.: US 6,800,839 B2
(45) Date of Patent: Oct. 5, 2004

(54) DEVICE FOR THE OPTOELECTRONIC DETECTION OF SWITCHING POSITIONS OF A SWITCHING ELEMENT

(75) Inventor: Gregor Boehne, Castrop-Rauxel (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 0 days.

(21) Appl. No.: 10/755,493

(22) Filed: Jan. 12, 2004

(65) Prior Publication Data

US 2004/0144914 A1 Jul. 29, 2004

Related U.S. Application Data

(63) Continuation of application No. PCT/EP02/09485, filed on Aug. 24, 2002.

(30) Foreign Application Priority Data

Aug. 28, 2001 (DE) .......................................... 101 41 975

(51) Int. Cl.$^7$ ............................................... H01J 40/14
(52) U.S. Cl. ............................... 250/214 PR; 250/229; 250/214 SW
(58) Field of Search .................... 250/214 SW, 214 PR, 250/229, 221, 341.7, 341.1; 200/506

(56) References Cited

U.S. PATENT DOCUMENTS 3,628,037 A  * 12/1971  Yamamoto et al. ......... 250/229
3,668,407 A  * 6/1972   Matzen et al. .............. 250/229
3,946,225 A     3/1976   Beeck
4,856,785 A     8/1989   Lantz et al.
5,062,214 A    11/1991   Gustafsson et al.
5,371,359 A  * 12/1994   Hagiuda et al. ............ 250/229
6,495,832 B1 * 12/2002   Kirby ....................... 250/341.7

FOREIGN PATENT DOCUMENTS

DE    39 36 434 A1    5/1991
GB    1 453 298       11/1973
RU    2 029 428 C1    2/1995

\* cited by examiner

*Primary Examiner*—Stephone B. Allen
*Assistant Examiner*—Patrick J. Lee
(74) *Attorney, Agent, or Firm*—Brooks Kushman P.C.

(57) ABSTRACT

An optoelectronic switch position detection apparatus for detecting the switch positions of a switch element movable in switch position steps in a switch direction with each switch position step corresponding to a switch position includes receivers, a light, and a shutter. The receivers are arranged at a distance correspondingly from each other of a switch position step in the switch direction of the switch element. The shutter is coupled to the movement of the switch element to move relative to the receivers and the light as the switch element moves in the switch direction between switch positions. The state of one of the receivers changes between an exposed state in which the receiver is exposed to the light and a shaded state in which the shutter shades the receiver from the light when the switch element moves in the switch direction from one switch position to an adjacent switch position.

12 Claims, 2 Drawing Sheets

DEVICE FOR THE OPTOELECTRONIC DETECTION OF SWITCHING POSITIONS OF A SWITCHING ELEMENT

CROSS-REFERENCE TO RELATED APPLICATIONS

This is a continuation of International Application PCT/EP02/09485, published in German, with an international filing date of Aug. 24, 2002, which claims priority to DE 101 41 975.9 filed on Aug. 28, 2001.

BACKGROUND OF THE INVENTION

1. Field of the Invention

The present invention relates to an apparatus for the optoelectronic detection of switching positions of a mechanically actuatable switching element, and relates in particular to such an apparatus having individual photoelectric receivers, a light source arranged to expose the receivers, and a shutter which is movable relative to the light source and the receivers and is coupled to the movement of the switching element.

2. Background Art

Apparatuses for detecting switching positions are used in switches which are assigned multiple functions in order to allow a user to recognize the switching positions of the multifunction switch. Such switches are used as lighting and steering column switches in motor vehicles. These types of switches are configured to be movable in multiple planes to allow the functions to be executed independently of one another and in parallel to one another. Backlit symbols are assigned to the switch in order to represent the respective switching positions. The symbols light as a function of the respective switch position to indicate the switch position.

These types of switches are conventionally configured as contact switches so that a switch position is attained if the corresponding electrical connection is produced by the switching organ. Even if different functions can be switched with such a multifunctional switch, the cost increases inordinately in case of complicated switch structures if the respective switch positions are to be detected in the above-described visual manner. Moreover, the elements provided for mechanical contact-making are subject to the effects of wear and aging.

In addition to the switch position determination being displayed to a user, the respective switching position should also be made accessible as a data input to a data processing system such as an onboard computer in motor vehicles for monitor and control purposes.

Multifunctional switches can be configured as contactless optoelectronic-functioning switches, as is known from DE 43 32 748 A1. The switch described in this document is characterized in that no electrical contact-making is brought about in order to detect a switching position. Instead, a photosensitive element acting as a receiver is exposed to light if the switching element is in a certain switching position.

An optical switch of this sort includes, besides the photosensitive element, a light source which can be arranged on the same board as the photosensitive element. By means of a fiber-optical member whose area on the light output side is arranged facing the photosensitive surface of the photoelectric element, the required light is brought to the photoelectric element. A movement gap is between the output side of the fiber-optical member and the photoelectric element. A shutter is movable in the movement gap and is coupled to the movement of the switching element to move therewith. The shutter has an opening at a specified position. After a movement of the switching element to a certain switching position, the opening becomes aligned with the area on the output side of the fiber-optical member and the photosensitive surface of the photoelectric element so that the photoelectric element can be exposed to the light.

If the switching element is removed from this position, the shutter shades the photoelectric element from the light and the switching position is exited. In the subject matter of this document, each switching position is thus realized through its own optoelectronic switch. Through suitable arrangement of several such optical switches complicated switching operations can be detected. However, under conditions where installation space is limited, it is not possible to realize complicated switching operations in the described manner.

DE 298 17 668 U1 discloses another switching position detection apparatus which is configured to function in an optoelectronic manner. In the subject matter of this document, a light source is coupled to the movement of the switching element and is thus tracked along with any movement the switching element makes. The light source acts upon a two-dimensional sensor array formed from a plurality of individual converter elements, e.g., a camera sensor. Switching position detection occurs as a function of which converter elements of the sensor array are exposed to light as a function of the position of the switching element. However, this known switching position detection apparatus requires a microprocessor for its evaluation and is thus more expensive than the previously described switching position detection apparatus.

SUMMARY OF THE INVENTION

Starting out from the described background art, the underlying object of the present invention is to provide a switching position detection apparatus that can be implemented using simple means while avoiding the disadvantages of the described background art.

This object is solved according to the present invention in that at least two receivers are arranged in each case at a distance correspondingly from each other of at least one switching step in the switching direction of the switching element and that the shutter has a shading region through which in each case of a switching position of the switching element the state of only a single receiver changes when the switching position of the switching element changes to an adjacent switching position.

Moreover, the present invention is characterized by an apparatus for the optoelectronic detection of switching positions of a mechanically actuatable switching element. The apparatus includes a photoelectric receiver, a plurality of light sources arranged to expose the receiver, and a shutter. The light sources and the receiver are movable relative to the shutter and are coupled to the movement of the switching element. The light sources include at least two light sources which are arranged in each case at a distance correspondingly from each other of at least one switching step in the switching direction of the switching element. The shutter has a shading region through which in each case of a switching position of the switching element the state of only a single light source changes its state in terms of an exposure of the receiver when the switching position of the switching element changes to an adjacent switching position.

The switching position detection apparatus according to a first embodiment of the present invention, unlike the known background art, uses a receiver arrangement formed from at least two receivers and a shutter having a shading region. The shading region of the shutter is configured such that in response to each change in the switching position of the switching element only one receiver changes its state. For example, the shading region can be designed such that all of the receivers are simultaneously shaded.

Four switching steps can be detected when using two receivers in a configuration of this sort. At least two receivers are arranged in each case at a distance correspondingly from each other of at least one switching step in the switching direction of the switching element. As the shutter has a shading region with which possibly both receivers can be simultaneously shaded, a switching position is defined in this manner. It is also possible to shade only one receiver, shade only the other receiver, and shade neither receiver with the three other switching positions in a configuration of this sort being defined in this manner.

If four switching steps are provided and if a partial shading of individual receivers is not provided, then only two receivers are required. As such, the number of receivers is reduced by 50% compared to the number of receivers required in the known background art. If partial shading of individual receivers is provided, then the number of required receivers can be further reduced compared to the known background art.

In the present invention, erroneous interpretations are avoided as only a single receiver changes its state in response to a change in the switching position of the switching element to an adjacent switching position. This state change can be caused through exposure of a previously unexposed receiver or vice versa, or also by changing the exposure intensity, e.g., through regional or partial shading of a receiver by the shutter.

The switching position detection apparatus in accordance with a second embodiment of the present invention is similarly configured with the roles of the light source and the receivers being swapped. In the second embodiment, at least two light sources are provided with a single receiver. The light emitted by the light sources is encoded, e.g., pulsed over time. A switching position of the switching element can be detected based on a corresponding evaluation of the received signal. A light encoding can take place, for example, also via a wavelength with different light sources emitting light with different wavelengths.

The switching position detection apparatus according to the present invention is also suitable for carrying out a switching position detection if the switching element is movable in two or more directions. In each direction of movement of the switching element, a receiver arrangement including at least two receivers and the shutter with its shading region is conceived (as described above). Due to the decrease in hardware compared with the known background art, even complicated switching operations can be detected in an optoelectronic manner with a switching position detection apparatus of this sort without the need for a larger installation space.

The use of a microprocessor to use the switching position detection apparatus of the present invention is not necessary as the evaluation can take place via a digital circuit in which the output signal of the switching position detection apparatus feeds into for processing. For example, a digital circuit of this sort can be a binary decoder.

The use of an infrared (IR) light source is preferred for operating the switching position detection apparatus in accordance with the present invention. In a configuration of this sort, in each case a filter which passes IR light is connected upstream of the receivers being used so that the switching position detection apparatus does not need to be encapsulated with respect to otherwise disruptive daylight.

For the case in which a microprocessor is available in the surroundings of the switching position detection apparatus, such as in a motor vehicle, instead of using discrete photoelectric receivers, a sensor array formed from a plurality of individual photoelectric receivers, e.g., a row or camera sensor can be used.

BRIEF DESCRIPTION OF THE DRAWINGS

The present invention is described hereafter based on exemplary embodiments with reference to the attached figures. The figures are as follows.

DETAILED DESCRIPTION OF THE PREFERRED EMBODIMENT(S)

Figure 1A:
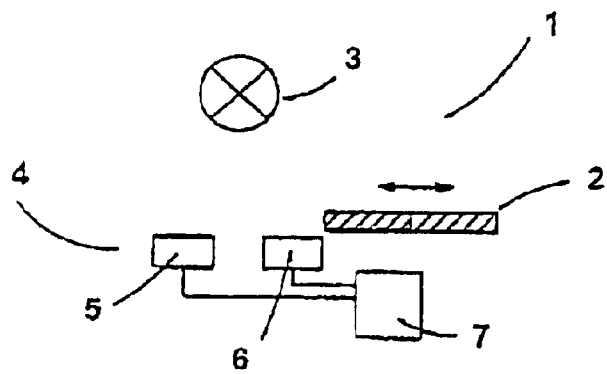
FIGS. 1a, 1b, 1c, and 1d illustrate schematic representations of an optoelectronic switching position detection apparatus in accordance with a first embodiment of the present invention with which four switching positions can be implemented in a switching direction of the switching element.

FIG. 1a illustrates a schematic representation of a switching position detection apparatus 1 in accordance with a first embodiment of the present invention. Apparatus 1 includes a shutter 2 which is movably connected to a switching element (not shown) to move with the movement of the switching element. Shutter 2 forms a shading region in its full width. Shutter 2 is coupled to the movement of the switching element and is displaceable in the plane indicated by the double arrow. The representation of the movement of shutter 2 in a plane is a simplified representation. The switching element may be coupled so as to be swivelable about a rotational axis such that shutter 2 moves on an orbit in response to movement of the switching element.

A light source 3 is arranged on one side of shutter 2. Light source 3 is fixed in place in a stationary manner with respect to shutter 2. Light source 3 includes light emitting diodes (LED) which emit IR light in the shown exemplary embodiment. A receiver arrangement 4 is arranged on the opposite side of shutter 2. Receiver arrangement 4 is also fixed in place in a stationary manner with respect to shutter 2. Receiver arrangement 4 includes two discrete photoelectric receivers 5, 6. Light source 3 and light receivers 5, 6 are arranged in an expedient manner on a common board. Light receivers 5, 6 are IR-sensitive. In order to suppress daylight reflections, a filter which passes only IR light is connected upstream of light receivers 5, 6. Light receivers 5, 6 are connected to an evaluation circuit 7.

Figure 1B:
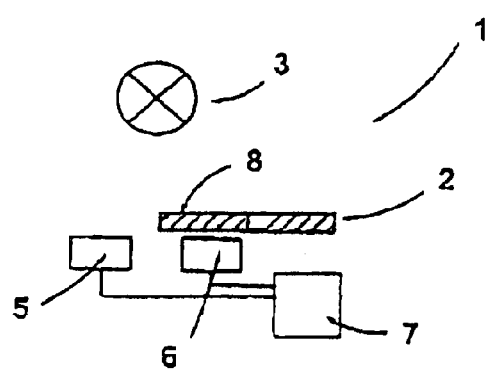

With switching position detection apparatus 1, four switching positions of the switching element can be implemented. FIG. 1a shows the first switching position in which both light receivers 5, 6 are exposed to light from light source 3. As such, the first switching position is characterized by an output signal indicating exposure of both light receivers 5, 6 to light source 3. FIG. 1b illustrates the second switching position of the switching element in which light receiver 5 is exposed to light from light source 3 while light receiver 6 is shaded from the light source by a front part 8 of shutter 2. As such, the second switching position is characterized by an output signal indicating a sole exposure of light receiver 5 to light source 3.

Figure 1C:
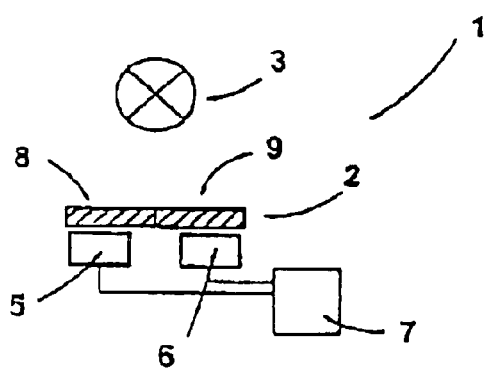
Figure 1D:
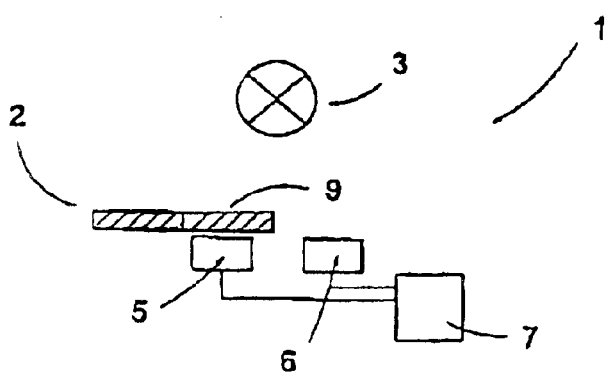

FIG. 1c illustrates the third switching position of the switching element in which both light receivers 5, 6 are shaded with respect to the light emitted by light source 3. In the third switching position, front region 8 of shutter 2 shades light receiver 5 and a rear region 9 of the shutter shades light receiver 6. As such, the third switching position is characterized by an output signal indicating no exposure of either light receiver 5, 6 to light source 3. FIG. 1d illustrates the fourth switching position of the switching element in which rear region 9 of shutter 2 shades light receiver 5 from light source 3 while light receiver 6 is exposed to light source 3. As such, the fourth switching position is characterized by an output signal indicating a sole exposure of light receiver 6 to light from light source 3.

In the switching position sequence as shown, it is recognizable that a position change leads only to the change of the state of a single light receiver 5 or 6. In this manner, erroneous interpretations are prevented which could arise if two light receivers were to change their state simultaneously and not after one another.

Figure 2:
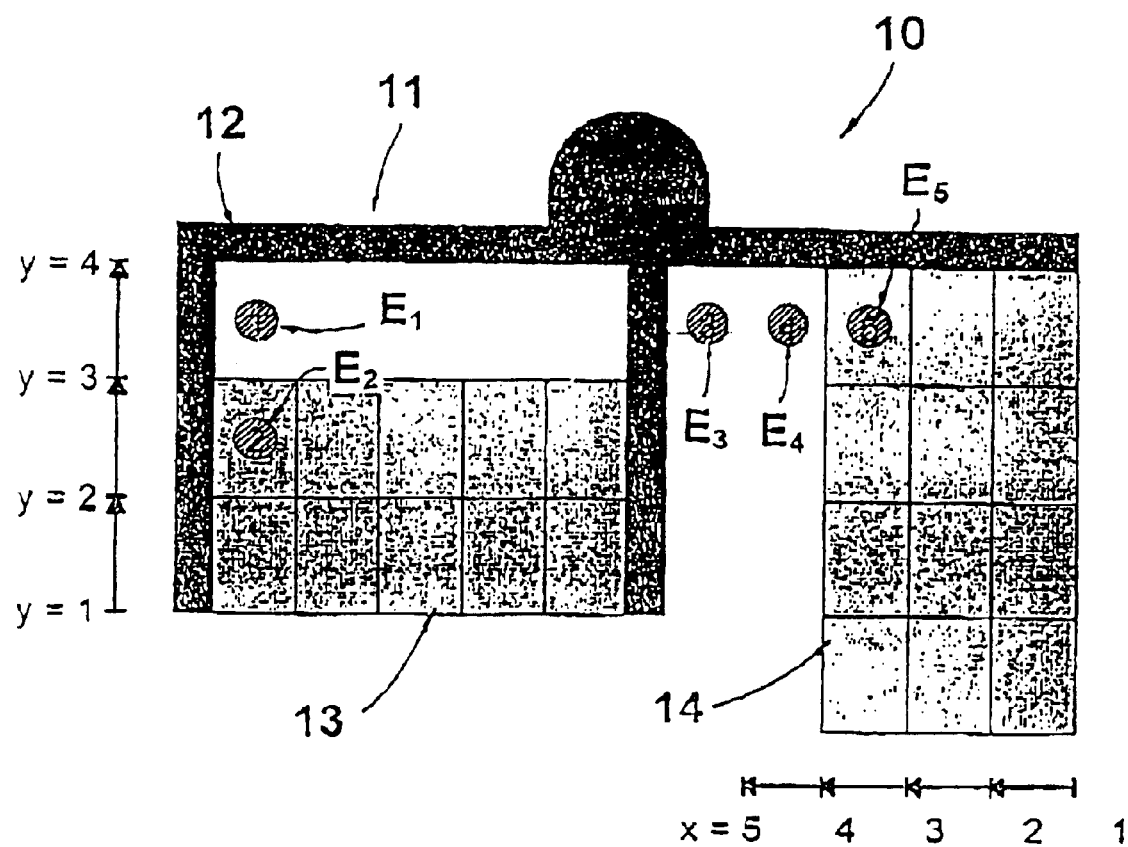
FIG. 2 illustrates a schematic representation of an optoelectronic switching position detection apparatus in accordance with a second embodiment of the present invention whose switching element is movable in two directions.

FIG. 2 illustrates a schematized representation of a switching position detection apparatus 10 in accordance with a second embodiment of the present invention. Switching position detection apparatus 10 enables switching position detection in two directions. The switching element of switching position detection apparatus 10 is supported so as to be swivelable about two rotational axes. A shutter 11 is coupled to the movement of the switching element. Shutter 11 is built in the shown exemplary embodiment from a holder 12 which supports two shading strips 13, 14. Each shading strip 13, 14 is used for switching position detection of a light receiver arrangement in each case.

A receiver arrangement formed from receivers $E_1$ and $E_2$ is used for switching position detection of a movement of the switching element in the y direction. Another receiver arrangement formed from receivers $E_3$, $E_4$, and $E_5$ is used for detecting a switching position of the switching element in the x direction. The receivers $E_1$, $E_2$ and $E_3$, $E_4$, and $E_5$ are arranged at a distance correspondingly from each other of one switching step in each case. Shading strips 13, 14 are sectioned into boxes in order to illustrate the different switching positions of the switching element. In the y direction, four switching positions can be detected through the use of the two receivers $E_1$, $E_2$. In the x direction, five switching positions can be detected in this embodiment through the use of the three receivers $E_3$, $E_4$, and $E_5$. The states of the individual receivers $E_1$ $E_2$, $E_3$, $E_4$, and $E_5$ in the different switching positions of switching position detection apparatus 10 are given in the following table:

| y position | $E_1$ | $E_2$ |
|---|---|---|
| 1 | light | dark |
| 2 | dark | dark |
| 3 | dark | light |
| 4 | light | light |

| x position | $E_3$ | $E_4$ | $E_5$ |
|---|---|---|---|
| 1 | light | light | dark |
| 2 | light | dark | dark |
| 3 | dark | dark | dark |
| 4 | dark | dark | light |
| 5 | dark | light | light |

In order to detect six x switch positions, the described arrangement can be modified such that the shading strip 13 is six boxes wide. The "x=six" position can be determined when the receivers $E_3$, $E_4$, and $E_5$ are exposed to light from the light source.

Shutter 11 is laid out in a plane in FIG. 2 to simplify its representation. Preferably, shutter 11 is curved. The midpoint of the curve is located at the intersection of the two rotational axes of the switching element. In the immediate vicinity of the intersection of the rotational axes of the switching element, the light source (not shown in FIG. 2) is also arranged.

From the description of the present invention, it is clear that with the described switching position detection apparatuses a plurality of switching positions, e.g., of a steering column switch of a motor vehicle, can be detected even in a relatively small installation space and with only a minimum of hardware. Instead of the arrangement shown in the figures in which the shutters are movable and the receiver(s) and the light source(s) are arranged in a stationary manner, it can also be provided to arrange the shutter in a stationary manner and arrange the other elements to be movable. In this case, a sensor array, e.g., a camera sensor, on which discrete regions of a switching position are assigned may be used instead of discrete receivers.

The terms shading, shading region, and shading strip used herein includes on the one hand an arrangement as is described in the figures so that a direct shading takes place through a shading region of this sort. However, these terms can also be understood to mean a configuration in which mirrors are also used for the shutter so that the light source(s) and the receiver(s) are arranged on the same side of the shutter and an exposure of a receiver takes place in a corresponding mirror position.

What is claimed is:

1. An apparatus for the optoelectronic detection of switch positions of a mechanically actuatable switch element, wherein the switch element is movable in switch position steps in first and second switch directions with each switch position step in the first and second switch directions corresponding to a switch position of the switch element, the apparatus comprising:

a light source;

a first plurality of photoelectric receivers each being arranged at a distance correspondingly from each other of a switch position step in the first switch direction of the switch element;

a first shutter coupled to the movement of the switch element to move relative to the first plurality of receivers and the light source as the switch element moves in the first switch direction between switch positions;

wherein the state of one of the first plurality of receivers changes between an exposed state in which the receiver is exposed to the light source and a shaded state in which the first shutter shades the receiver from the light source when the switch element moves in the first switch direction from one switch position to an adjacent switch position;

a second plurality of receivers each being arranged at a distance correspondingly from each other of a switch position step in the second switch direction of the switch element;

a second shutter coupled to the movement of the switch element to move relative to the second plurality of receivers and the light source as the switch element moves in the second switch direction between switch positions;

wherein the state of one of the second plurality of receivers changes between an exposed state in which the receiver is exposed to the light source and a shaded state in which the second shutter shades the receiver from the light source when the switch element moves in the second switch direction from one switch position to an adjacent switch position.

2. The apparatus of claim 1 wherein the switch element is supported in a rotatable manner about an axis wherein:

the first and second plurality of receivers are located in a region of an intersection of the axis and the shutter has a curved surface.

3. The apparatus of claim 1 wherein:

the light source is an infrared (IR) light source and the first and second plurality of receivers are IR sensitive receivers having filters which pass IR light.

4. The apparatus of claim 1 further comprising:

a binary decoding circuit for generating an output signal based on the states of the first and second plurality of receivers.

5. The apparatus of claim 1 wherein:

the first and second plurality of receivers form a light sensor array.

6. An apparatus for the optoelectronic detection of switch positions of a mechanically actuatable switch element, wherein the switch element is movable in switch position steps in first and second switch directions with each switch position step in the first and second switch directions corresponding to a switch position of the switch element, the apparatus comprising:

first and second photoelectric receivers;

a first plurality of light sources for exposing the first receiver to light, wherein each light source of the first plurality of light sources is arranged at a distance correspondingly from each other of a switch position step in the first switch direction of the switch element;

a second plurality of light sources for exposing the second receiver to light, wherein each light source of the second plurality of light sources is arranged at a distance correspondingly from each other of a switch position step in the second switch direction of the switch element;

a first shutter for shading the first receiver from the first plurality of light sources; and a second shutter for shading the second receiver from the second plurality of light sources;

wherein the first plurality of light sources and the first receiver are coupled to the switch element to move relative to the first shutter as the switch element moves in the first switch direction between switch positions;

wherein the state of one of the light sources of the first plurality of light sources changes between an exposure state in which the light source exposes the first receiver to light and a shaded state in which the first shutter shades the first receiver from the light source when the switch element moves in the first switch direction from one switch position to an adjacent switch position;

wherein the second plurality of light sources and the second receiver are coupled to the switch element to move relative to the second shutter as the switch element moves in the second switch direction between switch positions;

wherein the state of one of the light sources of the second plurality of light sources changes between an exposure state in which the light source exposes the second receiver to light and a shaded state in which the second shutter shades the second receiver from the light source when the switch element moves in the second switch direction from one switch position to an adjacent switch position.

7. The apparatus of claim 6 wherein the switch element is supported in a rotatable manner about an axis wherein:

the first and second plurality of light sources are located in a region of an intersection of the axis and the shutter has a curved surface.

8. The apparatus of claim 6 wherein:

the first and second plurality of light sources are infrared (IR) light sources and the first and second receivers are IR sensitive receivers having a filter which passes IR light.

9. The apparatus of claim 6 further comprising:

a binary decoding circuit for generating an output signal based on the states of the first and second receivers.

10. The apparatus of claim 6 wherein:

the first and second receivers form a light sensor array.

11. A method for use with a light source for the optoelectronic detection of switch positions of a mechanically actuatable switch element, the switch element being movable in switch position steps in first and second switch directions with each switch position step in the first and second switch directions corresponding to a switch position of the switch element, the method comprising:

arranging a first plurality of photoelectric receivers at a distance correspondingly from each other of a switch position step in the first switch direction of the switch element;

arranging a second plurality of photoelectric receivers at a distance correspondingly from each other of a switch position step in the second switch direction of the switch element;

coupling a first shutter to the switch element to move relative to the first plurality of receivers and the light source as the switch element moves in the first switch direction between switch positions such that the state of one of the first plurality of receivers changes between an exposed state in which the receiver is exposed to the light source and a shaded state in which the first shutter shades the receiver from the light source when the switch element moves in the first switch direction from one switch position to an adjacent switch position; and coupling a second shutter to the switch element to move relative to the second plurality of receivers and the light source as the switch element moves in the second switch direction between switch positions such that the state of one of the second plurality of receivers changes between an exposed state in which the receiver is exposed to the light source and a shaded state in which the second shutter shades the receiver from the light source when the switch element moves in the second switch direction from one switch position to an adjacent switch position.

12. A method for use with first and second shutters and first and second photoelectric receivers for the optoelectronic detection of switch positions of a mechanically actuatable switch element, the switch element being movable in switch position steps in first and second switch directions with each switch position step in the first and second switch directions corresponding to a switch position of the switch element, the method comprising:

arranging a first plurality of light sources at a distance correspondingly from each other of a switch position step in the first switch direction of the switch element;

arranging a second plurality of light sources at a distance correspondingly from each other of a switch position step in the second switch direction of the switch element;

coupling the first plurality of light sources and the first receiver to the switch element to move relative to the first shutter as the switch element moves in the first switch direction between switch positions such that the state of one of the light sources of the first plurality of light sources changes between an exposure state in which the light source exposes the first receiver to light and a shaded state in which the first shutter shades the first receiver from the light source when the switch element moves in the first switch direction from one switch position to an adjacent switch position; and coupling the second plurality of light sources and the second receiver to the switch element to move relative to the second shutter as the switch element moves in the second switch direction between switch positions such that the state of one of the light sources changes between an exposure state in which the light source exposes the second receiver to light and a shaded state in which the second shutter shades the second receiver from the light source when the switch element moves in the second switch direction from one switch position to an adjacent switch position.

* * * * *